United States Patent
Soga et al.

(10) Patent No.: US 10,310,025 B2
(45) Date of Patent: Jun. 4, 2019

(54) CONTROL DEVICE AND CONTROL METHOD FOR ELECTRIC VEHICLE

(71) Applicant: NISSAN MOTOR CO., LTD., Yokohama-shi, Kanagawa (JP)

(72) Inventors: Tsutomu Soga, Machida (JP); Atsushi Takano, Sagamihara (JP)

(73) Assignee: NISSAN MOTOR CO., LTD., Yokohama-shi (JP)

(*) Notice: Subject to any disclaimer, the term of this patent is extended or adjusted under 35 U.S.C. 154(b) by 764 days.

(21) Appl. No.: 14/384,438

(22) PCT Filed: Mar. 8, 2013

(86) PCT No.: PCT/JP2013/056460
§ 371 (c)(1),
(2) Date: Sep. 11, 2014

(87) PCT Pub. No.: WO2013/137141
PCT Pub. Date: Sep. 19, 2013

(65) Prior Publication Data
US 2015/0134282 A1 May 14, 2015

(30) Foreign Application Priority Data
Mar. 13, 2012 (JP) .................................. 2012-056385
Nov. 19, 2012 (JP) .................................. 2012-253594

(51) Int. Cl.
*B60L 3/12* (2006.01)
*B60L 58/12* (2019.01)
(Continued)

(52) U.S. Cl.
CPC ............ *G01R 31/3842* (2019.01); *B60L 3/12* (2013.01); *B60L 58/12* (2019.02); *G01R 31/367* (2019.01);
(Continued)

(58) Field of Classification Search
None
See application file for complete search history.

(56) References Cited

U.S. PATENT DOCUMENTS 5,371,682 A * 12/1994 Levine ............... G01R 31/3624
320/136
5,606,242 A * 2/1997 Hull ....................... H02J 7/0004
320/106
(Continued)

FOREIGN PATENT DOCUMENTS

JP          2006-038495 A       2/2006

*Primary Examiner* — Alexander Satanovsky
*Assistant Examiner* — Brent A. Fairbanks
(74) *Attorney, Agent, or Firm* — Foley & Lardner LLP

(57) ABSTRACT

A residual capacity calculation apparatus for a battery includes a current detection device to detect a charge/discharge current of the battery and a voltage detection device to detect an open circuit voltage of the battery, and a controller. The controller is configured to calculate a first residual capacity based on an integrated value of the charge/discharge current of the battery, calculate a second residual capacity based on the open circuit voltage of the battery, determine a blend rate of the second residual capacity based on a deviation between the first residual capacity and the second residual capacity, calculate a post-combination residual capacity by subjecting the first residual capacity and the second residual capacity to weighted combination with use of the blend rate, and increase the blend rate as the deviation between the first residual capacity and the second residual capacity increases.

5 Claims, 10 Drawing Sheets

(51) Int. Cl.
 *G01R 31/36* (2019.01)
 *H01M 10/48* (2006.01)
 *G01R 31/367* (2019.01)
 *G01R 31/3828* (2019.01)
 *G01R 31/3842* (2019.01)

(52) U.S. Cl.
 CPC ........ G01R 31/3648 (2013.01); H01M 10/48 (2013.01); *B60L 2240/545* (2013.01); *B60L 2240/547* (2013.01); *B60L 2240/549* (2013.01); *B60L 2260/44* (2013.01); *G01R 31/3828* (2019.01); *Y02T 10/7005* (2013.01); *Y02T 10/705* (2013.01); *Y02T 10/7044* (2013.01)

(56) References Cited

U.S. PATENT DOCUMENTS

| | | | | |
|---|---|---|---|---|
| 2003/0097225 | A1* | 5/2003 | Teruo | G01R 31/3624 702/63 |
| 2007/0145948 | A1* | 6/2007 | Lim | B60L 11/1887 320/132 |
| 2010/0036626 | A1* | 2/2010 | Kang | G01R 31/3648 702/63 |
| 2010/0138178 | A1* | 6/2010 | Paryani | G01R 31/3624 702/63 |

* cited by examiner

CONTROL DEVICE AND CONTROL METHOD FOR ELECTRIC VEHICLE

TECHNICAL FIELD

This invention relates to a calculation of a residual capacity of a battery.

BACKGROUND ART

As a method of determining a residual capacity of a battery, there are known a method involving detecting a charge/discharge current (hereinafter simply referred to as "current") and calculating the residual capacity based on a current integrated value obtained by integrating the detected currents, and a method of calculating the residual capacity based on an open circuit voltage. The method based on the current integrated value is capable of obtaining a stable residual capacity even when a load drastically fluctuates, for example, but a current detection error is liable to accumulate. On the other hand, the method based on the open circuit voltage can determine the residual capacity accurately, but the calculation value significantly fluctuates when the load drastically fluctuates, for example.

In view of this, in the residual capacity calculating apparatus of JP 2006-38495 A, in order to improve the accuracy of estimating the residual capacity, a residual capacity determined based on a current integrated value and a residual capacity determined based on an open circuit voltage that is estimated based on an internal resistance are subjected to weighted combination with use of a weight that is set based on a current change rate.

With this, by taking advantages of the calculation method based on the current integrated value and the calculation method based on the open circuit voltage, the accuracy of estimating the residual capacity is improved.

SUMMARY OF INVENTION

By the way, in the calculation method based on the current integrated value, with use of a residual capacity (SOC) estimated at an open circuit voltage measurable timing, such as the time of activation, as a reference point, a residual capacity change amount (SOC change amount) is determined by dividing the current integrated value by a full charge capacity estimation value. The residual capacity change amount is used to calculate the residual capacity. Therefore, for example, when the full charge capacity reduces due to a cell abnormality, calculation is made with use of a full charge capacity estimation value that is larger than the true full charge capacity, with the result that a value smaller than the true change amount is calculated as the residual capacity change amount. As a result, a residual capacity larger than the true residual capacity is calculated, and the error with respect to the true residual capacity increases as charging and discharging are continued.

However, in the residual capacity calculating apparatus of JP 2006-38495 A, the weight that is set based on the current change rate is used for weighted combination. Therefore, when the full charge capacity reduces due to a cell abnormality or the like, the estimation error of the residual capacity increases.

This invention therefore has an object to suppress the estimation error of the residual capacity even when the full charge capacity reduces due to the cell abnormality or the like.

According to one embodiment of this invention, there is provided a residual capacity calculation apparatus for a battery, including current detection means for detecting a charge/discharge current of the battery, and voltage detection means for detecting a terminal voltage of the battery. The residual capacity calculation apparatus for a battery further includes first residual capacity calculation means for calculating a first residual capacity based on an integrated value of the charge/discharge current of the battery, and second residual capacity calculation means for calculating a second residual capacity based on an open circuit voltage of the battery. The residual capacity calculation apparatus for a battery further includes blend rate setting means for determining a blend rate of the second residual capacity based on a deviation between the first residual capacity and the second residual capacity, and third residual capacity calculation means for subjecting the first residual capacity and the second residual capacity to weighted combination with use of the blend rate. Further, the blend rate setting means is configured to increase the blend rate as the deviation between the first residual capacity and the second residual capacity increases.

A detailed description is given below of embodiments of this invention and advantages of this invention referring to the accompanying drawings.

DESCRIPTION OF EMBODIMENTS

Figure 1:
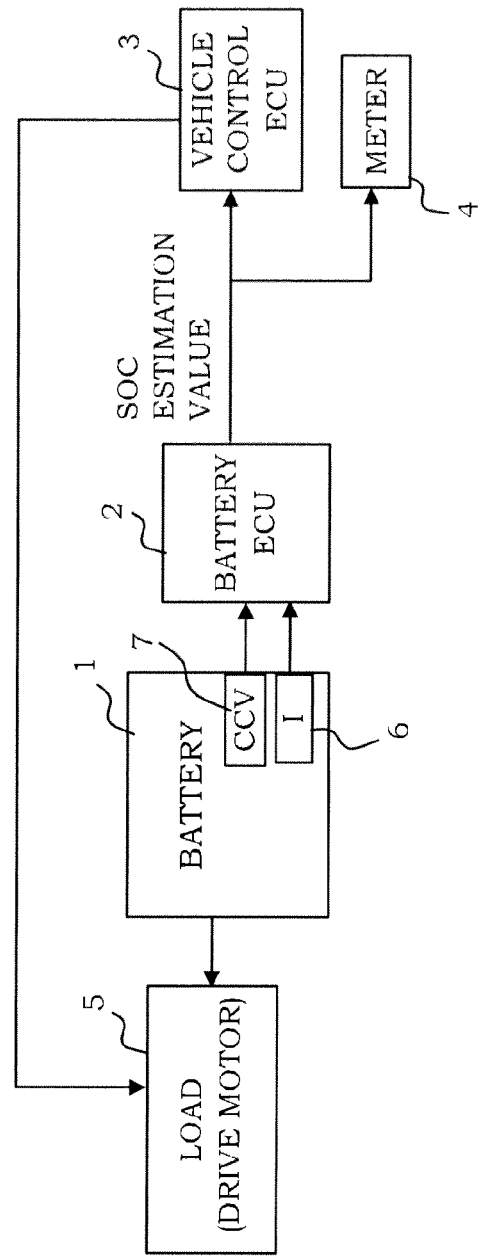
FIG. 1 is a configuration diagram of a vehicle system according to an embodiment of this invention.

FIG. 1 is a system configuration diagram of a case where this invention is applied to an electric vehicle. This system includes a battery 1, a load 5 that operates with power supplied from the battery 1, a battery controller (hereinafter referred to as "battery ECU") 2 for estimating the residual capacity (residual capacity rate with respect to the full charge capacity, hereinafter referred to as "state of charge (SOC)") of the battery 1, and a vehicle controller (hereinafter referred to as "vehicle control ECU") 3 for controlling the load 5 based on an SOC estimation value. The load 5 is, for example, a drive motor serving as a drive source for the vehicle.

The battery 1 includes a plurality of electric cells. For example, the plurality of electric cells are connected in series-parallel to each other (a plurality of parallel members in which the plurality of electric cells are connected in parallel are connected in series).

The battery ECU 2 calculates an SOC estimation value based on detection signals from a voltage sensor 7 for detecting a terminal voltage CCV of the battery 1 and a current sensor 6 for detecting a charge/discharge current of the battery 1. Specific details of calculation are described later.

Note that, the battery ECU 2 includes a microcomputer including a central processing unit (CPU), a read-only memory (ROM), a random access memory (RAM), and an input/output interface (I/O interface). The battery ECU 2 may include a plurality of microcomputers. The same holds true for the vehicle control ECU 3 to be described later.

The SOC estimation value calculated by the battery ECU 2 is transmitted to the vehicle control ECU 3 or a meter 4 through the battery ECU 2 and a controller area network (CAN) communication.

The vehicle control ECU 3 determines whether or not the SOC is sufficient based on the SOC estimation value transmitted from the battery ECU 2. When the SOC is insufficient, for example, the power consumption of the load 5 is limited. The meter 4 indicates the SOC estimation value to the driver.

Further, the battery ECU 2 sets an upper limit value of power consumption to be set by the vehicle control ECU 3 so that the terminal voltage of the battery 1 falls within an allowable range.

Figure 2:
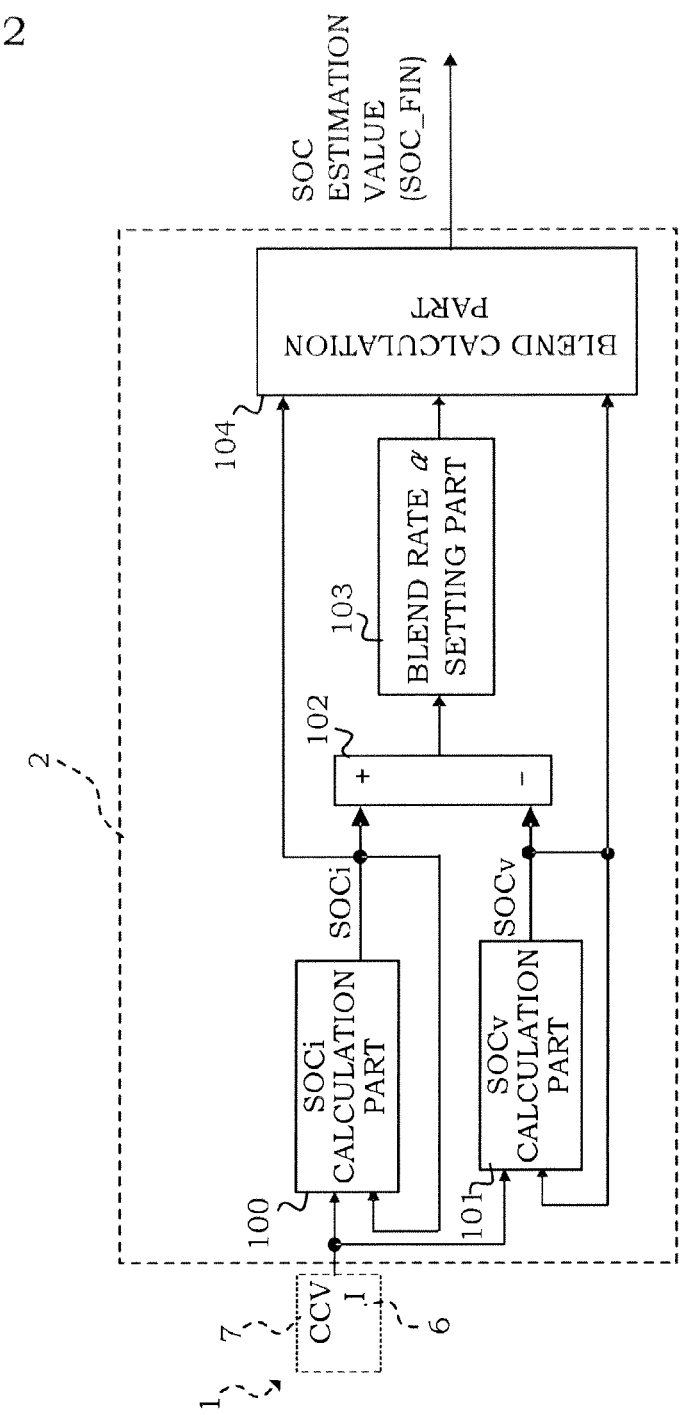
FIG. 2 is a control block diagram illustrating an example of an SOC arithmetic algorithm.

FIG. 2 is a control block diagram illustrating an example of an SOC arithmetic algorithm in the battery ECU 2. In this algorithm, an SOC estimation value SOCv based on a voltage and an SOC estimation value SOCi based on a current integrated value are calculated, and a value obtained through weighted combination with use of a blend rate α [%] that is set based on the difference between the SOC estimation value SOCv and the SOC estimation value SOCi is set as an SOC estimation value SOC_FIN. It should be noted that the blend rate α is a weight of the SOC estimation value SOCv based on the voltage in the weighted combination. Now, the algorithm according to a first embodiment of this invention is described. It should be noted that the blend rate herein refers to a ratio (weight) of the SOC estimation value SOCv based on the voltage and the SOC estimation value SOCi based on the current integrated value when the SOC estimation value SOCv and the SOC estimation value SOCi are subjected to weighted combination.

In an SOCi calculation part 100, the SOC estimation value SOCi based on the current integrated value is calculated by the following procedure.

First, a timing after a state in which the current value is substantially 0 is continued for a predetermined time period (a state in which a current and a voltage generated by an internal resistance are negligibly small is continued for a time period for enabling depolarization), and at which the terminal voltage CCV becomes substantially equal to the open circuit voltage, such as the time of activation or after continuation of a low current, is set as an open circuit voltage measurable timing. The terminal voltage CCV is measured at the timing to measure the open circuit voltage, and the SOC estimation value based on the open circuit voltage is calculated in advance.

Further, the full charge capacity is also calculated in advance. The full charge capacity is calculated based on Expression (1) with use of, for example, a change amount ΔAh of the current integrated value [Ah] from a time point when the open circuit voltage is measured last time to a time point when the open circuit voltage is measured this time and an SOC change amount ΔSOC calculated based on the change of the open circuit voltage.

$$\text{Full charge capacity estimation value} = \Delta Ah / \Delta SOC \quad (1)$$

Then, with use of an SOC estimated based on the open circuit voltage measured this time as a reference point, an SOC change amount is obtained by dividing the current integrated value by the full charge capacity estimation value. An SOC estimated with use of the SOC change amount is set as the SOC estimation value SOCi based on the current integration.

In this case, the method of calculating the SOC estimation value SOCi based on the current integration is not limited to the above. For example, the SOCi may be calculated by measuring the open circuit voltage to calculate the SOC estimation value based on the open circuit voltage similarly to the above, and subtracting an SOC change amount corresponding to the current integrated value from a time point when the SOC estimation value is calculated to the present time. It should be noted that the SOC change amount corresponding to the current integrated value can be calculated based on, for example, a map representing the correlationship between the current integrated value and the SOC change amount, which is determined by an experiment or the like in advance.

In this case, it is known that the degree of deterioration of the battery (decrease amount of the full charge capacity) has correlation with the internal resistance of the battery. Therefore, a relationship between the current integrated value and the SOC change amount, which corresponds to the internal resistance of the battery, may be stored in advance as a map. By referring to the map stored in advance based on the actually detected current integrated value, the SOC change amount corresponding to the current integrated value can be determined. In other words, for calculation of the SOC estimation value SOCi, the full charge capacity is not necessarily used directly. By using a parameter representing the current integrated value and the full charge capacity (in the example above, the internal resistance, in other words, the degree of deterioration), the SOC estimation value SOCi corresponding to the full charge capacity can be calculated. It should be noted that the internal resistance of the battery can be easily calculated based on the voltage change with respect to the current change during charging and discharging.

The change rate of the estimation value SOCi is less diverged from the true SOC change rate, and hence the discomfort given to the driver is small at the time of indication on the meter 4.

However, in the calculation of the estimation value SOCi, the open circuit voltage is not measured until the next open circuit voltage measureable timing after the reference point is set, and the estimation value SOCi is calculated based on the current integrated value and the preset full charge capacity (full charge capacity when the reference point is set). Therefore, even when the full charge capacity of the battery 1 decreases during discharging, such as when connection of a part of the cells forming the parallel members is cancelled, the estimation value SOCi is calculated with use of the full charge capacity before the decrease. As a result, for example, when the change of the current integrated value during discharging is converted into the change of the SOC, the SOC change amount is calculated to be smaller than the true SOC change amount. Therefore, the estimation value SOCi cannot follow the decrease of the true SOC. Therefore, when the estimation value SOCi is indicated on the meter 4, the indicated value becomes larger than the true SOC.

Figure 4:
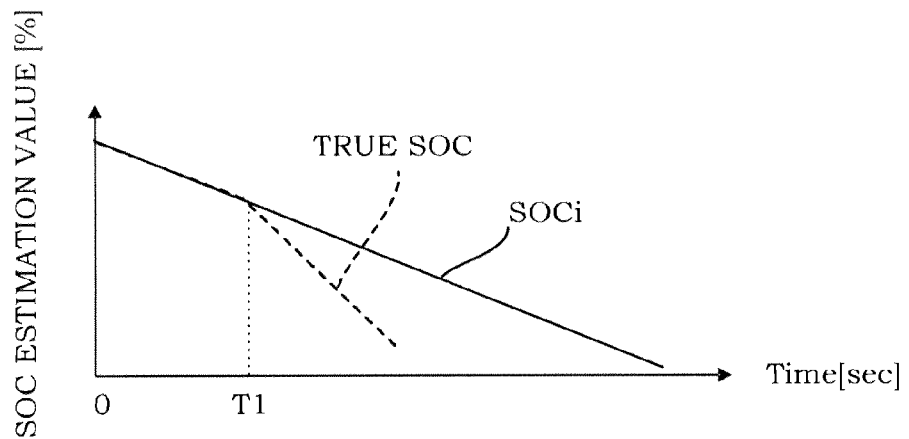
FIG. 4 is a time chart of a case where a full charge capacity drastically decreases during discharging.

FIG. 4 is a time chart of a case where the full charge capacity decreases at a timing T1 during discharging of the battery 1. Until the timing T1, the estimation value SOCi can follow the true SOC, but after the timing T1, the change amount of the estimation value SOCi becomes smaller than the true SOC change amount, and as the time elapses, the divergence between the estimation value SOCi and the true SOC increases.

Further, also during charging, the SOC change amount is calculated to be smaller than the true SOC change amount, and thus when the estimation value SOCi is indicated on the meter 4, the indicated value becomes smaller than the true SOC.

On the other hand, in an SOCv calculation part 101, the SOC estimation value SOCv based on the voltage is calculated by the following procedure.

First, the terminal voltage CCV and the current I are read, and an internal resistance estimation value R is estimated based on the terminal voltage CCV and the current I. Next, an open circuit voltage OCV is estimated with use of Expression (2). It should be noted that, in this embodiment, the value of the current I is positive in a discharging direction and is negative in a charging direction.

$$OCV=CCV+R \times I \qquad (2)$$

Figure 3:
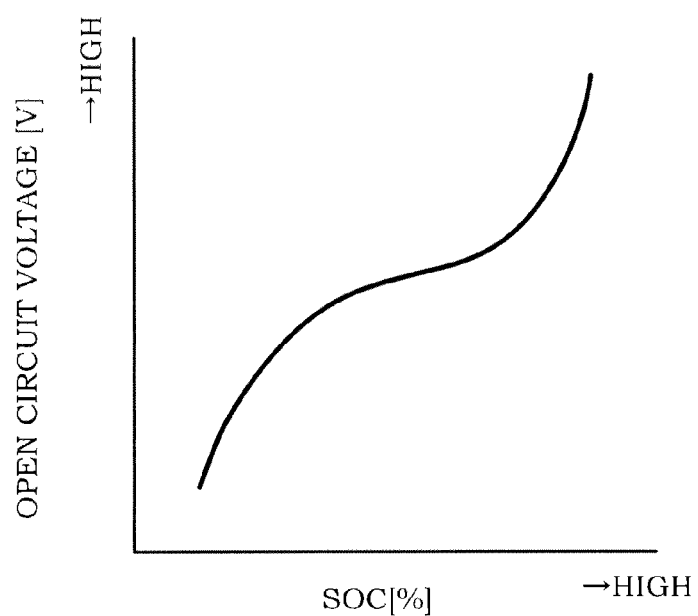
FIG. 3 shows an example of a map representing a relationship between an open circuit voltage OCV and an SOC.

The estimated open circuit voltage OCV is converted into the estimation value SOCv with use of a map representing a relationship between the open circuit voltage OCV and the SOC. The relationship between the open circuit voltage OCV and the SOC is determined based on characteristics of the cells, and hence the relationship is predetermined by an experiment or the like to be mapped, and is stored in the SOCv calculation part 101. FIG. 3 shows an example of the map representing the relationship between the open circuit voltage OCV and the SOC.

The terminal voltage CCV is used for the calculation of the estimation value SOCv, and the terminal voltage CCV decreases as the true SOC decreases. Therefore, the estimation value SOCv follows the true SOC change with high accuracy. It should be noted that, when a noise is superimposed on the measurement result of the terminal voltage CCV, the value fluctuates (the value vibrationally changes from the true value). Therefore, when the estimation value SOCv is indicated on the meter 4, for example, although the running is continued (the battery 1 is discharging), the indicated SOC may be temporarily increased by the fluctuation due to the noise, and the discomfort may be given to the driver.

The estimation value SOCi and the estimation value SOCv calculated as described above are read into a deviation calculation part 102.

In the deviation calculation part 102, the estimation value SOCv is subtracted from the estimation value SOCi to calculate the deviation (hereinafter referred to as "estimation value deviation"), and the calculation result is output to a blend rate α setting part 103.

Figure 5:
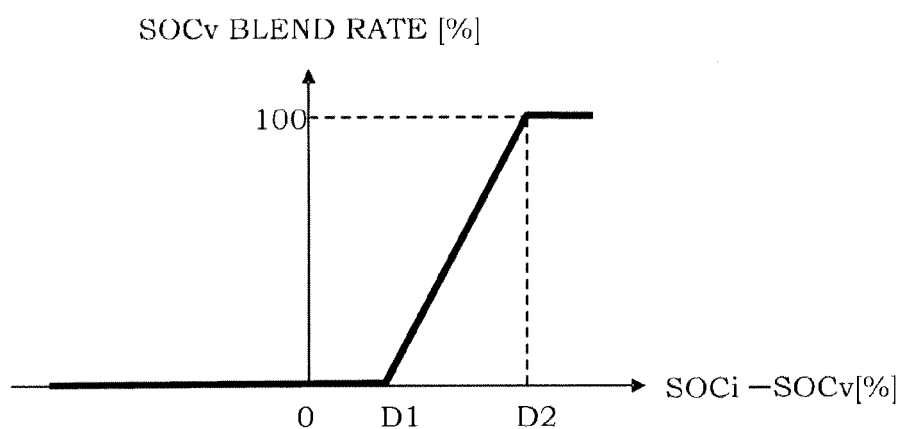
FIG. 5 shows an example of a blend rate map for discharging.
Figure 6:
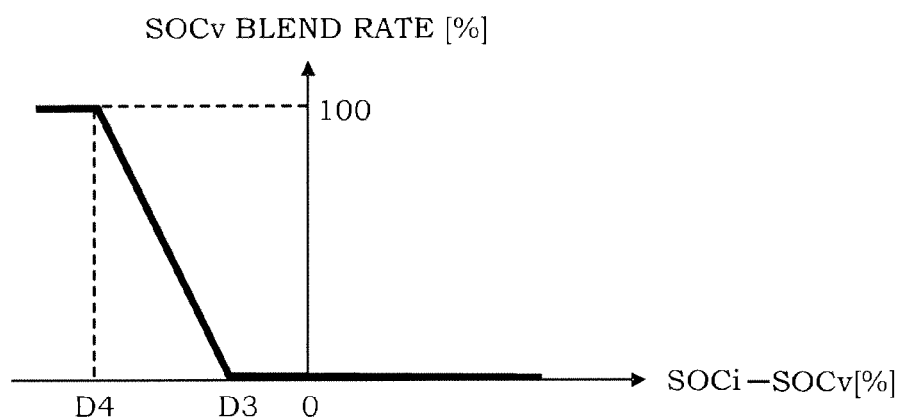
FIG. 6 shows an example of a blend rate map for charging.

The blend rate α setting part 103 uses blend rate α setting maps of FIGS. 5 and 6 created and stored in advance to set the blend rate α of the estimation value SOCv. FIG. 5 is a map used during discharging, and FIG. 6 is a map used during charging. In both of the maps, the vertical axis represents a blend rate α, and the lateral axis represents an estimation value deviation.

Now, the blend rate α setting map is described.

During discharging, as the estimation value SOCi increases relative to the estimation value SOCv, and as the estimation value deviation increases, the estimation value SOCi cannot follow the change of the true SOC due to drastic decrease of the full charge capacity. Therefore, there is a possibility that the estimation value SOCi may be indicated as a value larger than the true SOC.

On the other hand, when the estimation value deviation is small, the estimation value SOCi is less liable to be indicated as a value larger than the true SOC. It should be noted that "when the estimation value deviation is small" includes a case where the estimation value SOCi is smaller than the estimation value SOCv.

Then, the blend rate α is set as shown in FIG. 5 so that the blend rate α is 0[%] when the estimation value deviation is equal to or less than D1, the blend rate α of the estimation value SOCv increases as the estimation value deviation increases between D1 to D2, and the blend rate α is 100[%] when the estimation value deviation is equal to or more than D2. With this, the blend rate α increases as there is a possibility that the estimation value SOCi may be diverged significantly from the true SOC, and finally the blend rate α becomes 100 [%]. Therefore, the post-weighted combination SOC can be caused to follow the true SOC. Further, when the estimation value SOCi is less liable to be higher than the true SOC, the weighted combination is performed without increasing the blend rate α, and hence the driver does not feel the discomfort with respect to the indication of the meter 4.

It should be noted that the estimation value deviations D1 and D2 and D3 and D4 to be described later are preset based on the battery 1 to be used.

During charging, as the estimation value SOCi decreases relative to the estimation value SOCv, and as the estimation value deviation increases in the negative direction, the estimation value SOCi cannot follow the change of the true SOC due to drastic decrease of the full charge capacity. Therefore, there is a possibility that the estimation value SOCi may be indicated as a value smaller than the true SOC. On the other hand, when the estimation value deviation is small, or when the estimation value SOCi is larger than the estimation value SOCv, the estimation value SOCi is less liable to be indicated as a value smaller than the true SOC.

Then, the blend rate α is set as shown in FIG. 6 so that the blend rate α is 0 [%] when the estimation value deviation is equal to or more than D3, the blend rate α of the estimation value SOCv increases as the estimation value deviation increases in the negative direction between D3 to D4, and the blend rate α is 100 [%] when the estimation value deviation is equal to or less than D4. With this, similarly to during discharging, the post-weighted combination SOC can be caused to follow the true SOC.

The blend rate α calculated as described above is read into a blend calculation part 104 together with the estimation value SOCi and the estimation value SOCv.

The blend calculation part 104 calculates a post-combination estimation value SOC_FIN based on Expression (3).

$$SOC\_FIN=SOCv \times \alpha + SOCi \times (1-\alpha) \qquad (3)$$

It should be noted that, regardless of charging or discharging, simply by increasing the blend rate α as the deviation between the estimation value SOCi based on the current integrated value and the estimation value SOCv based on the voltage value increases, the number of blend rate α setting maps may be reduced to 1 to reduce the calculation load. In this case, the blend rate α is increased even when the estimation value SOCi is lower than the true SOC during discharging, or when the estimation value SOCi is higher than the true SOC during charging, in other words, when there is less adverse effect even if the blend rate α is not increased. However, it is unlikely that the full charge capacity increases during charging and discharging, and the above-mentioned state is a state where the deviation is temporarily generated between the estimation value SOCi and the estimation value SOCv simply due to a noise or the like. In such a state, the deviation between the estimation value SOCi and the estimation value SOCv is relatively small, and increasing the blend rate α does not cause a large problem.

Figure 7:
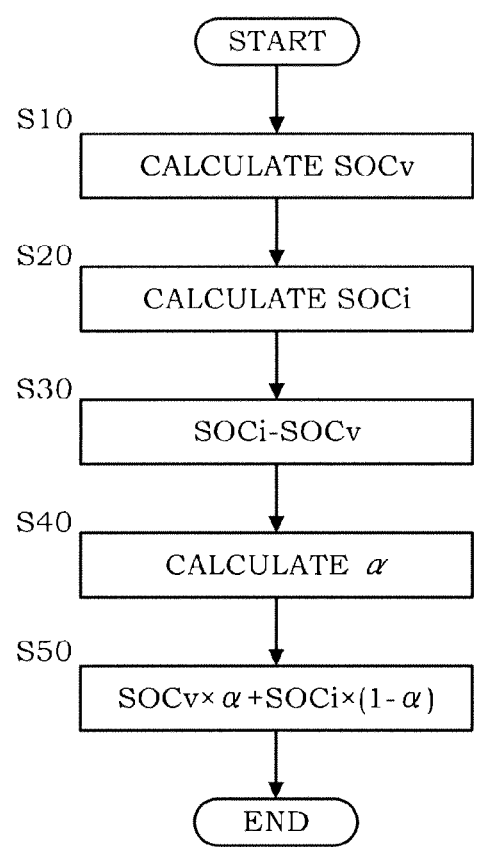
FIG. 7 is a flow chart of the SOC arithmetic algorithm.

FIG. 7 is a flow chart of the above-mentioned SOC arithmetic algorithm. This flow chart is repeatedly executed at a short interval of, for example, about 10 milliseconds by the battery ECU 2.

In Step S10, the battery ECU 2 calculates the estimation value SOCv in the SOCv calculation part 101, and in Step S20, the battery ECU 2 calculates the estimation value SOCi in the SOCi calculation part 100. It should be noted that Steps S10 and S20 may be performed in a random order.

Then, in Step S30, the battery ECU 2 calculates the estimation value deviation in the deviation calculation part 102, and in Step S40, the battery ECU 2 calculates the blend rate α in the blend rate α setting part 103 based on the estimation value deviation. In Step S50, the battery ECU 2 carries out weighted combination in the blend calculation part 104.

Figure 8:
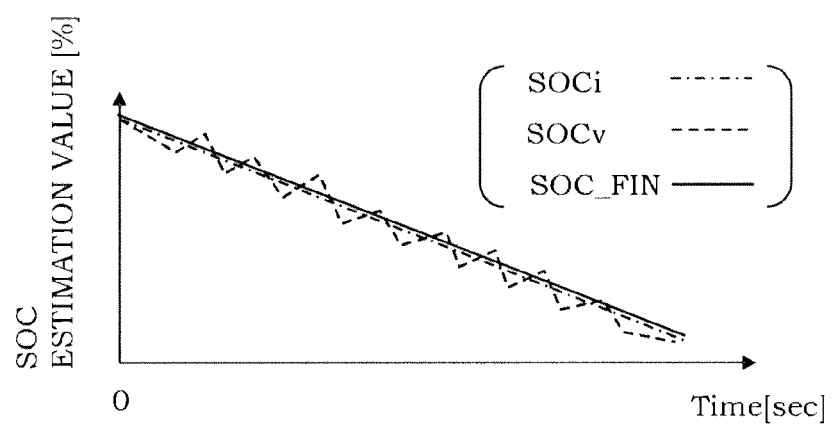
FIG. 8 is a time chart of a case where the battery is normal.
Figure 9:
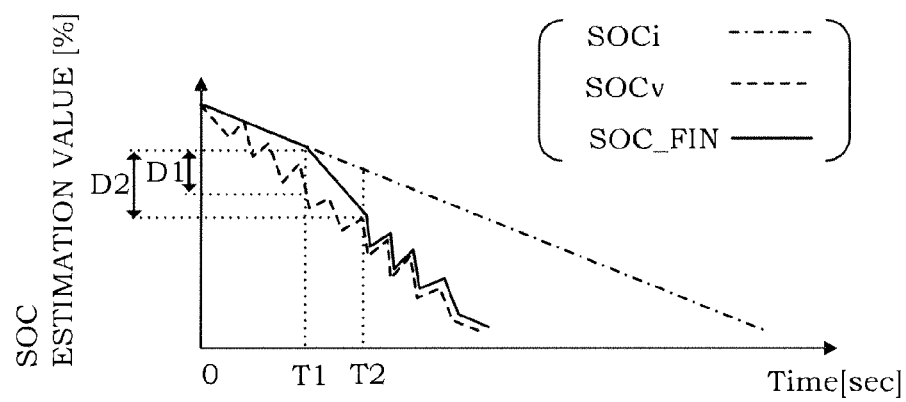
FIG. 9 is a time chart of a case where the full charge capacity drastically decreases in the middle.

FIGS. 8 and 9 are time charts of a case where the flow chart of FIG. 7 is executed during discharging. FIG. 8 shows a case where the battery 1 is normal, and FIG. 9 shows a case where the full charge capacity of the battery 1 drastically decreases. In FIGS. 8 and 9, the solid line represents the post-combination estimation value SOC_FIN, the broken line represents the estimation value SOCv, and the dashed-dotted line represents the estimation value SOCi. It should be noted that, in FIG. 8, the estimation value deviation does not exceed D1 of FIG. 5, and in FIG. 9, the estimation value deviation becomes D1 at the timing T1 and D2 at a timing T2.

When the battery 1 is normal, as shown in FIG. 8, although the estimation value SOCv repeatedly fluctuates due to a noise or the like, the estimation value SOCv decreases with a slope similar to that of the estimation value SOCi as viewed as a whole. Therefore, the estimation value deviation does not exceed D1 of FIG. 5, and the blend rate α is maintained to 0[%]. Therefore, the post-combination estimation value SOC FIN becomes equal to the estimation value SOCi. Therefore, the driver does not feel the discomfort with respect to the indication of the meter 4.

On the other hand, when the full charge capacity decreases due to the abnormality of the battery 1, as shown in FIG. 9, the slope of the estimation value SOCi becomes smaller than the slope of the estimation value SOCv, and hence the estimation value deviation increases as the time elapses. The blend rate α gradually increases from the timing T1 when the estimation value deviation becomes D1 to the timing T2 when the estimation value deviation becomes D2, and the blend rate α becomes 100 [%] at the timing T2. As a result, the post-combination estimation value SOC_FIN becomes equal to the estimation value SOCi prior to the timing T1, becomes gradually close to the estimation value SOCv between the timing T1 and the timing T2, and becomes equal to the estimation value SOCv at the timing T2. With this, the post-combination estimation value SOC_FIN can be caused to follow the true SOC.

It should be noted that, in the blend rate α setting maps of FIGS. 5 and 6, there is a region in which the blend rate α gradually changes, but the blend rate α may be changed in a stepped manner with use of a predetermined estimation value deviation as a boundary. With this, the post-combination estimation value SOC_FIN is the estimation value SOCi when the estimation value deviation is equal to or less than a predetermined value, and the post-combination estimation value SOC_FIN is switched to the estimation value SOCv when the estimation value deviation exceeds the predetermined value.

Further, between the timing T1 and the timing T2, there is a section in which the estimation value SOCv increases due to a noise or the like. The blend rate α decreases in this section, and hence the post-combination estimation value SOC_FIN does not become exactly a straight line unlike FIG. 9. However, although the estimation value SOCv repeatedly fluctuates vibrationally, the estimation value SOCv decreases as a whole. Therefore, in FIG. 9, the post-combination estimation value SOC_FIN is represented by a straight line for easy understanding of the transform from the estimation value SOCi to the estimation value SOCv.

Next, an SOC arithmetic algorithm according to a second embodiment of this invention is described. This embodiment differs from the first embodiment only in the method of calculating the estimation value SOCi based on the current integrated value in the SOCi calculation part 100, and hence the difference is described.

In this embodiment, by limiting the value that may be taken by the estimation value SOCi based on the current integrated value, even when the full charge capacity drastically decreases, the divergence between the estimation value SOCi and the true SOC is reduced. It should be noted that, in this embodiment, a battery temperature is detected by a temperature sensor.

Figure 10:
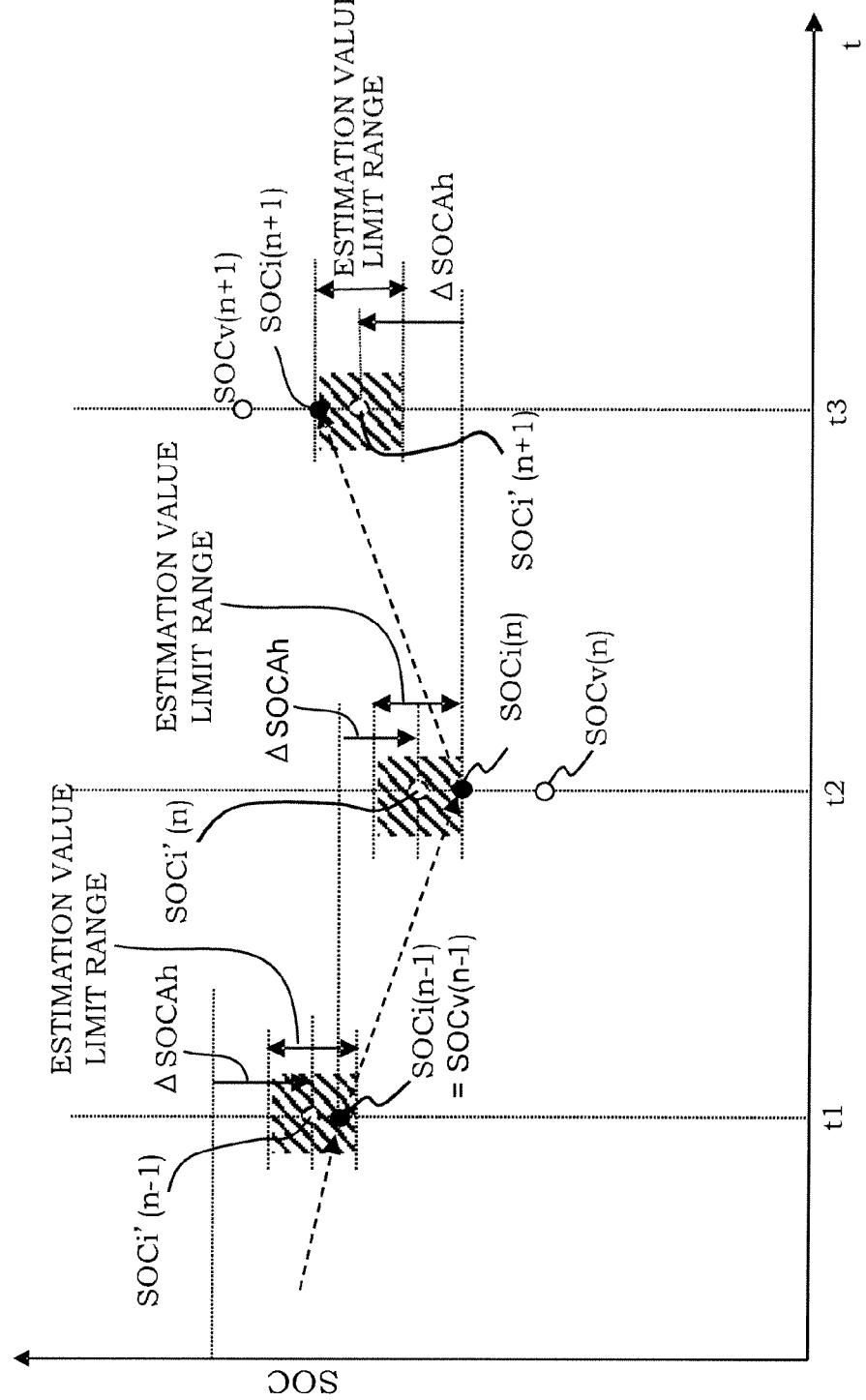
FIG. 10 is a diagram illustrating a limit range of an estimation value based on a current integrated value.

As illustrated in FIG. 10, the estimation value SOCi based on the current integrated value is determined with use of an SOC change amount, which is determined by dividing the current integrated value ∫I by the full charge capacity FullAh with use of an SOC at the time of start of charging or discharging (SOC 100% in FIG. 10) as a reference point.

Now, a method of estimating the full charge capacity FullAh is described. It should be noted that the full charge capacity FullAh may be the full charge capacity estimation value estimated with use of Expression (1) described above, but the full charge capacity FullAh is estimated by the following method in this case.

Figure 11:
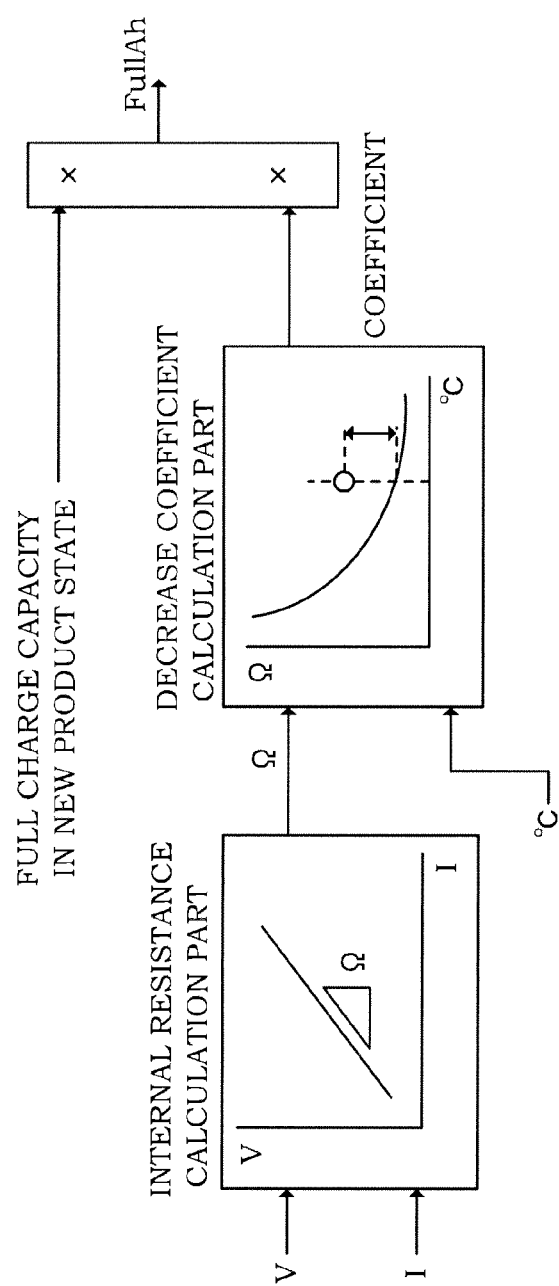
FIG. 11 is a block diagram illustrating an algorithm for estimating the full charge capacity.

FIG. 11 is a block diagram illustrating an algorithm for estimating the full charge capacity FullAh.

First, in an internal resistance calculation part, an internal resistance is calculated based on detection values of a current and a voltage at the time of charging or discharging. Then, a decrease coefficient calculation part reads the internal resistance f and the battery temperature, and uses the map created and stored in advance to determine a ratio of the internal resistance Ω at the temperature between the new product state and the present state. This ratio is converted into a decrease coefficient representing a decrease rate (specifically, a deterioration rate) of the full charge capacity. The map used here represents the characteristics of the internal resistance with respect to the battery temperature in the new product state. The decrease coefficient based on the ratio of the internal resistance is preset, and the ratio is converted into the decrease coefficient based thereon.

The full charge capacity in the new product state, which is measured at the time of factory shipment or the like, is multiplied by the decrease coefficient calculated as described above, to thereby calculate the full charge capacity FullAh. For example, when the full charge capacity in the new product state is 60 [Ah], and the decrease coefficient calculated based on the internal resistance Ω and the battery temperature is 0.9, the present full charge capacity FullAh is estimated to be 60×0.9=54 [Ah].

Referring back to the method of calculating the estimation value SOCi based on the current integrated value, when the present estimation value SOCi is calculated with use of the SOC change amount ΔSOCAh based on the current integrated value II from the last time to the present time and the full charge capacity FullAh with respect to the previous value SOCi(n−1) of the estimation value SOCi, the present estimation value SOCi becomes SOCi'(n). Then, considering the error of the current integrated value ∫I due to the error of the current sensor 6, and the error of the SOC change amount ΔSOCAh based on the estimation error of the full charge capacity FullAh or the like, a range that may be taken by the present estimation value SOCi is the hatched range in FIG. 10 (hereinafter referred to as "change range"). In other words, the value that may be taken by the change amount of the estimation value SOCi in one calculation period from the last time to the present time is, at minimum, from the previous value SOCi(n−1) to the upper limit of the change range, and, at maximum, from the previous value SOCi(n−1) to the lower limit of the change range.

The range (change range) that may be taken by the change amount of the estimation value SOCi in one calculation period, which is determined as described above, is set with use of the previous estimation value SOCi(n−1) as a reference. Then, an estimation value limit range having the same width as the change range can be set, which has, at the center, an estimation value SOCi'(n), which decreases by the SOC change amount ΔSOCAh from the previous estimation value SOCi(n−1). Further, in this calculation method, the estimation value SOCv(n) determined based on the voltage is limited to a value within the estimation value limit range, which is a value that may be taken by the estimation value SOCi based on the current integrated value through the present calculation, to thereby calculate the estimation value SOCi(n) that is the present value of the estimation value SOCi.

In other words, an estimation value limit range is set, which has, at the center, the present estimation value SOCi'(n) calculated based on the current integrated value with use of the previous estimation value SOCi(n−1) as a reference. The estimation value SOCv(n) determined based on the voltage is limited to the estimation value limit range to set the final present estimation value SOCi(n). In other words, within the estimation value limit range having, at the center, the present estimation value SOCi'(n) calculated based on the current integrated value, the final present estimation value SOCi(n) is determined with use of the estimation value SOCv(n) determined based on the open circuit voltage. Specifically, an SOC range (estimation value limit range) is set with use of the estimation value SOCi estimated based on the current integrated value as a reference, and within the SOC range, the final present estimation value SOCi(n) is set with use of the estimation value SOCv(n) determined based on the open circuit voltage. The final estimation value SOCi(n) is basically a value limited based on the current integrated value, and can be said to be an SOC estimated based on the current integrated value.

Further specific description is made with reference to FIG. 10. It should be noted that, in FIG. 10, t2 represents the present estimation timing, and t1 represents the previous estimation timing. Details of calculation of the estimation value SOCi(n) at the present estimation timing are described.

With respect to the final estimation value SOCi(n) at the previous estimation timing (t1), the SOC change amount ΔSOCAh estimated based on the current integrated value from the last time (t1) to the present time (t2) is subtracted (subtracted in this case because the capacity change is in the discharging direction), to thereby calculate the present estimation value SOCi'(n). Then, the estimation value limit range is set based on the calculated present estimation value SOCi'(n), and the estimation value SOCv(n) determined based on the open circuit voltage is limited within the above-mentioned estimation value limit range to set the final present estimation value SOCi(n). In this case, when the estimation value SOCv(n) determined based on the open circuit voltage is larger than the estimation value limit range, the upper limit value of the estimation value limit range is set as the final estimation value SOCi(n). When the estimation value SOCv(n) determined based on the open circuit voltage is smaller than the estimation value limit range, the lower limit value of the estimation value limit range is set as the final estimation value SOCi(n). When the estimation value SOCv(n) determined based on the open circuit voltage is within the estimation value limit range, the estimation value SOCv(n) is set as the final estimation value SOCi(n).

Similarly, at a next estimation timing t3, with respect to the final estimation value SOCi(n) calculated at the present estimation timing t2, the SOC change amount ΔSOCAh estimated based on the current integrated value from the present time (t2) to the next time (t2) is added (added in this case because the capacity change is in the charging direction), to thereby calculate the estimation value SOCi'(n+1). The estimation value limit range is set based on the calculated estimation value SOCi'(n+1), and the estimation value SOCv(n+1) determined based on the open circuit voltage is limited within the estimation value limit range to set the final next estimation value SOCi(n+1).

Figure 12:
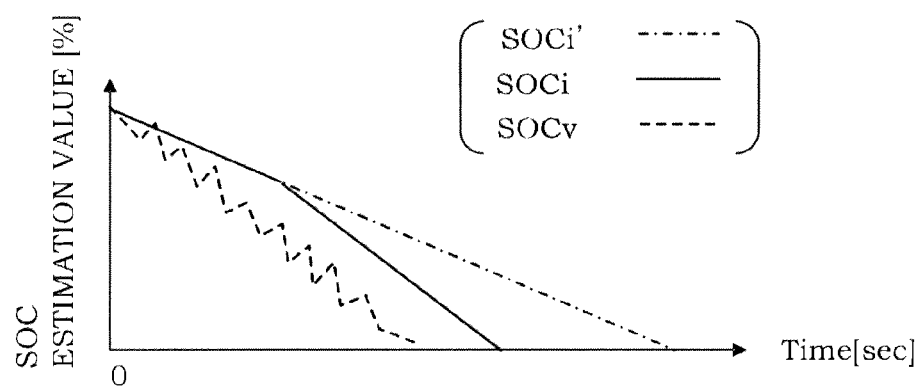
FIG. 12 is a time chart of a case where a limit range is provided to the estimation value based on the current integrated value.

In this embodiment, the above-mentioned calculation is repeated for every estimation timing of the estimation value SOCi, to thereby determine the estimation value SOCi With this, as shown in FIG. 12, the estimation value SOCi calculated based on the current integrated value transitions so as to follow the estimation value SOCv determined based on the voltage, as compared to the first embodiment. Therefore, divergence between the estimation value SOCi and the estimation value SOCv less occurs.

However, also in this calculation method, when the true full charge capacity drastically decreases due to the cell abnormality or the like, the full charge capacity FullAh is diverged from the true value, and hence the estimation value SOCi based on the current integrated value is also diverged from the true value. However, with the above-mentioned control of the blend rate α, it is possible to avoid indicating an SOC that is excessively larger than the true value on the meter 4.

Next, an SOC arithmetic algorithm according to a third embodiment of this invention is described. This embodiment differs from the first embodiment and the second embodiment only in the method of calculating the estimation value SOCv based on the voltage value in the SOCv calculation part 101, and hence the difference is described.

In this embodiment, the estimation value SOCv calculated by the same method as that in the first embodiment is subjected to filtering, to thereby suppress the fluctuation of the post-combination estimation value SOC_FIN that is indicated on the meter 4 when the blend rate α increases.

The filtering includes a rate limiter that limits a moving average, a weighted average, or a change rate to be described later.

In the case of the moving average, after the estimation value SOCv is calculated similarly to the first embodiment, for example, an average of calculation values in the past three times including the present calculation value is set as the present estimation value SOCv. In the case of the weighted average, after the estimation value SOCv is calculated similarly to the first embodiment, a value obtained by adding the weighted previous value and the weighted present value is set as the present estimation value SOCv.

The rate limiter refers to filtering of providing a limit to the change amount from the previous estimation value SOCv, and setting a value within the limit range as the present estimation value SOCv when the change amount of the estimation value SOCv obtained by the present calculation from the previous value exceeds the limit.

By suppressing the fluctuation of the estimation value SOCv by the filtering, it is possible to suppress the discomfort to be given to the driver when the meter 4 indicates the post-combination estimation value SOC FIN in which the blend rate α of the SOCv is increased.

The actions and effects of the embodiments described above can be summarized as follows.

The residual capacity calculation apparatus for a battery includes the SOCi calculation part 100 for calculating the estimation value SOCi based on the current integrated value, the SOCv calculation part 101 for calculating the estimation value SOCv based on the voltage value, and the blend rate α setting part 103 for determining the blend rate α of the estimation value SOCv based on the deviation between the estimation value SOCi and the estimation value SOCv. The residual capacity calculation apparatus further includes the blend calculation part 104 for calculating the post-weighted combination estimation value SOC_FIN with use of the blend rate α, and the blend rate α setting part 103 sets a larger blend rate α as the deviation between the estimation value SOCi and the estimation value SOCv increases. With this, when the error of the estimation value SOCi is large, the post-weighted combination estimation value SOC_FIN which is weighted based on the estimation value SOCv that is excellent in following performance to the true SOC, in other words, a residual capacity having a small divergence from the true SOC change is calculated. As a result, the residual capacity can be indicated to the driver with high accuracy.

The blend rate α setting part sets a larger blend rate α as the estimation value SOCi increases relative to the estimation value SOCv during discharging, or as the estimation value SOCv increases relative to the estimation value SOCi during charging. With this, when there is a substantial need to indicate the SOC to the driver with high accuracy, a highly accurate SOC can be indicated reliably.

Based on the detection value of the current sensor 6, the error estimated value of the current sensor 6, the full charge capacity FullAh, and the error estimated value of the full charge capacity FullAh, the change range of the first residual capacity in one calculation period is calculated. Then, the estimation value limit range in which the change range is set with respect to the estimation value SOCv of the previous calculation is set, and the estimation value SOCi is limited to the value in the estimation value limit range. With this, the estimation value SOCi follows the estimation value SOCv, and hence, as compared to the case where no limit is provided, an opportunity to increase the blend rate α reduces. As a result, it is possible to reduce the opportunity to give the discomfort to the driver by indicating the estimation value SOCv that finely fluctuates due to a noise or the like.

It should be noted that the case where a plurality of electric cells are connected in series-parallel to each other has been described, but as long as at least two electric cells are connected in parallel, similar effects can be obtained.

Though a description has been given of the embodiments of this invention, the embodiments describe only a part of application examples of this invention, and are not intended to limit the technical scope of this invention to the specific configurations of the above-mentioned embodiments.

This application claims priority from Japanese Patent Application No. 2012-56385, filed on Mar. 13, 2012 in the Japan Patent Office, and Japanese Patent Application No. 2012-253594, filed on Nov. 19, 2012 in the Japan Patent Office, the entire disclosure of which is incorporated herein by reference.

The invention claimed is:

1. A control device for an electric vehicle, comprising:
a current sensor adapted to detect a charge/discharge current of a battery of the vehicle;
a voltage sensor adapted to detect an open circuit voltage of the battery;
a battery controller adapted to detect a residual capacity of the battery based on the charge/discharge current detected by the current sensor and the open circuit voltage detected by the voltage sensor;
a vehicle controller configured to control an electric load arranged to operate with electric power supplied from the battery; and
a meter, wherein
the battery controller is programmed to:
calculate a first residual capacity based on an integrated value of the charge/discharge current of the battery detected by the current sensor;
calculate a second residual capacity based on the open circuit voltage of the battery detected by the voltage sensor;
determine a blend rate of the second residual capacity based on a deviation between the first residual capacity and the second residual capacity;
calculate a post-combination residual capacity by subjecting the first residual capacity and the second residual capacity to weighted combination with use of the blend rate;
increase the blend rate as the first residual capacity increases relative to the second residual capacity during discharging or as the second residual capacity increases relative to the first residual capacity during charging; and
use the calculated post-combination residual capacity as a detection value of the residual capacity of the battery to reduce an estimation error of the residual capacity of the battery due to a cell abnormality, and
the vehicle controller is further configured to, when it is determined that the post-combination residual capacity is insufficient, limit the electric power consumption of the electric load and cause the meter to display the post-combination residual capacity to a driver.

2. The control device for an electric vehicle according to claim 1, wherein the battery controller is further programmed to:
calculate a change range of the first residual capacity in one calculation period based on an integrated value of a detection value of the charge/discharge current in the one calculation period, a full charge capacity determined in advance, and an error estimated value including any one of a detection error of the current sensor or an error of the full charge capacity; and limit the second residual capacity to a value within an estimation value limit range to calculate a value as the first residual capacity.

3. The control device for an electric vehicle according to claim 1, wherein the post-combination residual capacity is a weighted sum of the first residual capacity and the second residual capacity.

4. A control method for an electric vehicle, a battery of the vehicle comprising a current sensor adapted to detect a charge/discharge current of the battery, and a voltage sensor adapted to detect an open circuit voltage of the battery; the control method comprising:

a first residual capacity calculation step of calculating a first residual capacity based on an integrated value of the charge/discharge current of the battery detected by the current sensor;

a second residual capacity calculation step of calculating a second residual capacity based on the open circuit voltage of the battery detected by the voltage sensor;

a step of setting a blend rate larger as the first residual capacity increases relative to the second residual capacity during discharging or as the second residual capacity increases relative to the first residual capacity during charging;

a third residual capacity calculation step of calculating a post-combination residual capacity by subjecting the first residual capacity and the second residual capacity to weighted combination with use of the blend rate;

a step of calculating a detection value of the residual capacity of the battery by using the post-combination residual capacity calculated by the third residual capacity calculation step as the detection value of the residual capacity of the battery to reduce an estimation error of the residual capacity of the battery due to a cell abnormality;

a step of limiting, when it is determined that the post-combination residual capacity is insufficient, an electric power consumption of an electric load arranged to operate with electric power supplied from the battery and causing a meter to display the post-combination residual capacity to a driver.

5. The method for an electric vehicle according to claim 4, wherein the post-combination residual capacity is a weighted sum of the first residual capacity and the second residual capacity.

* * * * *